(12) United States Patent
Huang et al.

(10) Patent No.: US 12,218,016 B2
(45) Date of Patent: Feb. 4, 2025

(54) SEMICONDUCTOR STRUCTURE

(71) Applicant: CHANGXIN MEMORY TECHNOLOGIES, INC., Hefei (CN)

(72) Inventors: Chen Huang, Hefei (CN); Meng-Feng Tsai, Hefei (CN); Yuejiao Shu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 580 days.

(21) Appl. No.: 17/479,154

(22) Filed: Sep. 20, 2021

(65) Prior Publication Data

US 2022/0077009 A1 Mar. 10, 2022

Related U.S. Application Data

(63) Continuation of application No. PCT/CN2021/101270, filed on Jun. 21, 2021.

(30) Foreign Application Priority Data

Sep. 4, 2020 (CN) .......................... 202010919564.0

(51) Int. Cl.
*H01L 23/528* (2006.01)
*H01L 21/66* (2006.01)
(52) U.S. Cl.
CPC ............ *H01L 22/32* (2013.01); *H01L 23/528* (2013.01)
(58) Field of Classification Search
CPC ........ H01L 22/32; H01L 22/34; H01L 23/528
See application file for complete search history.

(56) References Cited

U.S. PATENT DOCUMENTS 6,734,458 B2 * 5/2004 Kim ................ H01L 23/544
　　　　　　　　　　　　　　　　　　　438/18
6,992,327 B2 * 1/2006 Tone ................ H01L 22/34
　　　　　　　　　　　　　　　　　　　257/536

(Continued)

FOREIGN PATENT DOCUMENTS

CN　　　　103325806 A　　　9/2013
CN　　　　205231023 U　　　5/2016

(Continued)

OTHER PUBLICATIONS

International Search Report in the international application No. PCT/CN2021/101270, mailed on Aug. 30, 2021, 2 pgs.

(Continued)

*Primary Examiner* — Mounir S Amer
*Assistant Examiner* — Alexander Belousov
(74) *Attorney, Agent, or Firm* — Syncoda LLC; Feng Ma

(57) ABSTRACT

A semiconductor structure is provided with a test region. In test region, the semiconductor structure includes a semiconductor substrate, a plurality of bit line contact structures arranged on semiconductor substrate and a plurality of wire groups. The semiconductor structure is provided with a plurality of separate active regions extending along a first direction. In first direction, each active region is electrically connected to two bit line contact structures. The plurality of wire groups are arranged along a second direction. Each wire group includes a plurality of wires extending along a third direction. In third direction, each of two bit line contact structures for each active region is connected to respective one of two bit line contact structures for active region adjacent to said each active region by a respective one of wires, so that two wire groups of the wire groups cooperate with each other to form a conductive path.

13 Claims, 5 Drawing Sheets

(56) References Cited

U.S. PATENT DOCUMENTS

| | | | | |
|---|---|---|---|---|
| 7,847,288 B2* | 12/2010 | Kwon | | H01L 22/34 |
| | | | | 257/E29.024 |
| 8,878,293 B2* | 11/2014 | Jang | | H01L 21/76877 |
| | | | | 438/257 |
| 8,933,427 B2* | 1/2015 | Yi | | H10N 70/883 |
| | | | | 257/2 |
| 9,881,924 B2* | 1/2018 | Wang | | H10B 12/485 |
| 10,163,909 B2* | 12/2018 | Wang | | H10B 12/485 |
| 10,566,332 B2* | 2/2020 | Wang | | H10B 12/482 |
| 2003/0100134 A1* | 5/2003 | Kim | | H01L 23/544 |
| | | | | 438/18 |
| 2003/0222260 A1* | 12/2003 | Tone | | H01L 22/34 |
| | | | | 257/48 |
| 2013/0248798 A1* | 9/2013 | Yi | | H10N 70/8833 |
| | | | | 257/E45.001 |
| 2013/0264638 A1* | 10/2013 | Jang | | H01L 21/76897 |
| | | | | 257/334 |
| 2017/0330882 A1* | 11/2017 | Wang | | H01L 21/76224 |
| 2018/0102366 A1* | 4/2018 | Wang | | H01L 21/76224 |
| 2019/0088658 A1* | 3/2019 | Wang | | H01L 21/31144 |
| 2022/0077009 A1* | 3/2022 | Huang | | H01L 23/528 |

FOREIGN PATENT DOCUMENTS

| | | |
|---|---|---|
| CN | 205609515 U | 9/2016 |
| CN | 110071108 A | 7/2019 |
| CN | 110335861 A | 10/2019 |
| KR | 20000027539 A | 5/2000 |

OTHER PUBLICATIONS

International Search Report in the international application No. PCT/CN2021/100228, mailed on Aug. 26, 2021, 2 pgs.

* cited by examiner

SEMICONDUCTOR STRUCTURE

CROSS-REFERENCE TO RELATED APPLICATIONS

This application is a continuation application of International Patent Application No. PCT/CN2021/101270, filed on Jun. 21, 2021, which is based upon and claims priority to Chinese Patent Application No. 202010919564.0, filed on Sep. 4, 2020. The contents of International Patent Application No. PCT/CN2021/101270 and Chinese Patent Application No. 202010919564.0 are hereby incorporated by reference in their entireties.

TECHNICAL FIELD

The present application relates to the field of semiconductors, and in particular, to a semiconductor structure.

BACKGROUND

A semiconductor manufacturing process includes a front-end device process and a back-end metal interconnection process. The function of a back-end metal interconnection layer in the back-end metal interconnection process is to lead out a front-end device in the front-end device process for testing or work. During the semiconductor manufacturing, short-circuit failures or open-circuit failures often occur in the back-end metal interconnection wires, which are mainly caused by design problems and process problems. In order to evaluate a design structure and monitor the online process stability, a complex product structure is extracted separately or the structure used as a unit is recombined into a repeated, large-area and test-facilitating structure. These test structures are electrically tested to obtain a large number of corresponding electrical parameters, and these electrical parameters are analyzed to find problems in advance and solve the problems. This structure is referred to as test-key. The test-key covers almost all levels in the manufacturing process, and has the characteristics of easy testing, easy failure analysis, and the like.

In a semiconductor structure, a contact resistance of a bit line contact structure (BLC) that connects a bit line to an active region is an important factor affecting the performance of the semiconductor structure. Therefore, the contact resistance of the BLC is usually tested through the test-key. However, the test-key has a relatively large error when the contact resistance of the BLC is tested, which cannot meet the need.

SUMMARY

The present application provides a semiconductor structure, in which the semiconductor structure is provided with a test region. In the test region, the semiconductor structure includes:
  a semiconductor substrate provided with a plurality of separate active regions extending along a first direction;
  a plurality of bit line contact structures arranged on the semiconductor substrate, in which in the first direction, each active region is electrically connected to two bit line contact structures; and
  a plurality of wire groups arranged along a second direction, in which each wire group includes a plurality of wires extending along a third direction, and in the third direction, each of the two bit line contact structures for each active region is connected to a respective one of the two bit line contact structures for the active region adjacent to said each active region by a respective one of the wires, so that two wire groups of the wire groups cooperate with each other to form a conductive path.

DETAILED DESCRIPTION

Specific embodiments of a semiconductor structure provided by the present application are described in detail below in combination with accompanying drawings.

Figure 1:
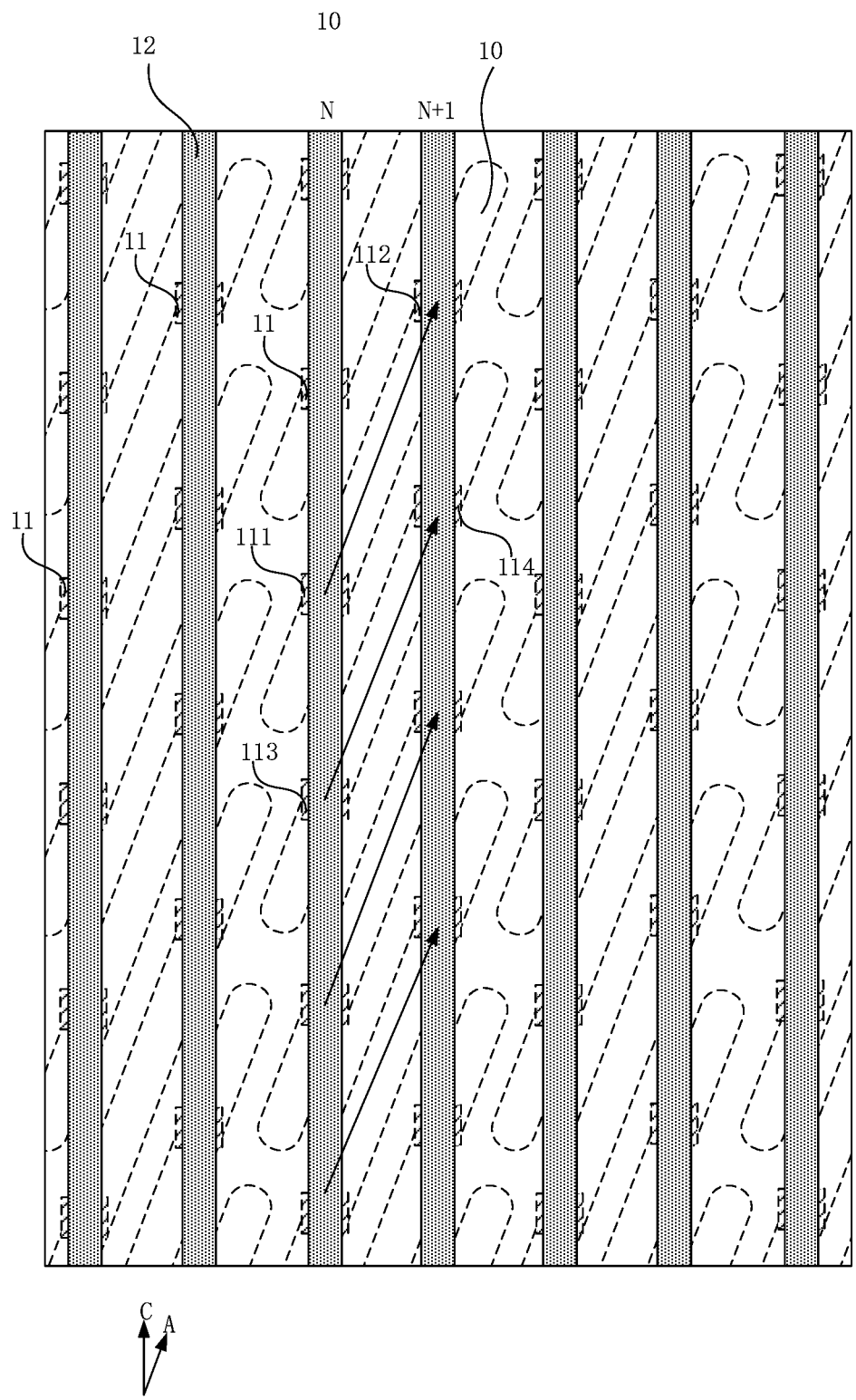
FIG. 1 is a schematic top view of a test-key structure for testing a contact resistance of a bit line contact structure in the related art.

FIG. 1 is a schematic top view of a test-key structure for testing a contact resistance of a bit line contact structure in the related art. Referring to FIG. 1, in an extending direction of an active region 10, that is, in a first direction A, each active region 10 is electrically connected to two bit line contact structures 11, and in a third direction C, a wire 12 electrically connects all the bit line contact structures arranged along this direction with each other.

Figure 2:
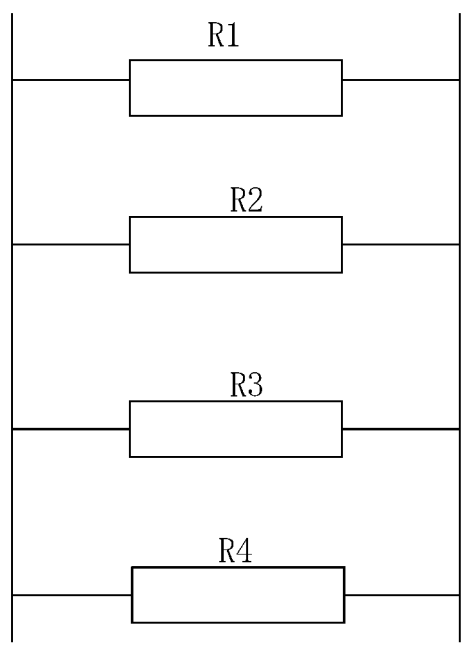
FIG. 2 is an equivalent circuit of a region where an arrow passes through in the test-key structure shown in FIG. 1.

When a test is performed, a voltage is applied to adjacent wires, so that two bit line contact structures 11 in the same active region 10 form a conductive path, and thus resistances of the bit line contact structures 11 can be measured. For example, when a test is performed, a voltage is applied to $N^{th}$ wire and $(N+1)^{th}$ wire adjacent to each another. The $N^{th}$ wire is used as a positive electrode, and the $(N+1)^{th}$ wire is used as a negative electrode. The $N^{th}$ wire, the bit line contact structures 111 and 112 electrically connected to the same active region 10, and the $(N+1)^{th}$ wire form a conductive path (as shown by the arrow in FIG. 1) with resistance R1. The $N^{th}$ wire, the bit line contact structures 113 and 114 electrically connected to the same active region 10, and the $(N+1)^{th}$ wire form a conductive path (as shown by the arrow in FIG. 1) with resistance R2. The rest may be deduced by analogy, and a plurality of conductive paths are formed, with resistances respectively R1, R2, R3 and R4. These conductive paths are connected in parallel, and an equivalent circuit formed by these conductive paths is shown in FIG. 2. Applying a voltage to the $N^{th}$ wire and the $(N+1)^{th}$ wire can obtain the resistances of these conductive paths, that is, the resistances of the bit line contact structures can be measured.

However, as the number of the parallel conductive paths increases, a measurement error is relatively large, which cannot meet the need. The reason for this phenomenon is that as the number of the parallel conductive paths increases, the numerical value of the total resistance after the parallel connection becomes smaller and smaller, and tiny external interferences will affect measurement results and cause relatively large measurement errors.

Therefore, the present application provides a semiconductor structure, which can reduce a measurement error and improve the test accuracy.

Figure 3:
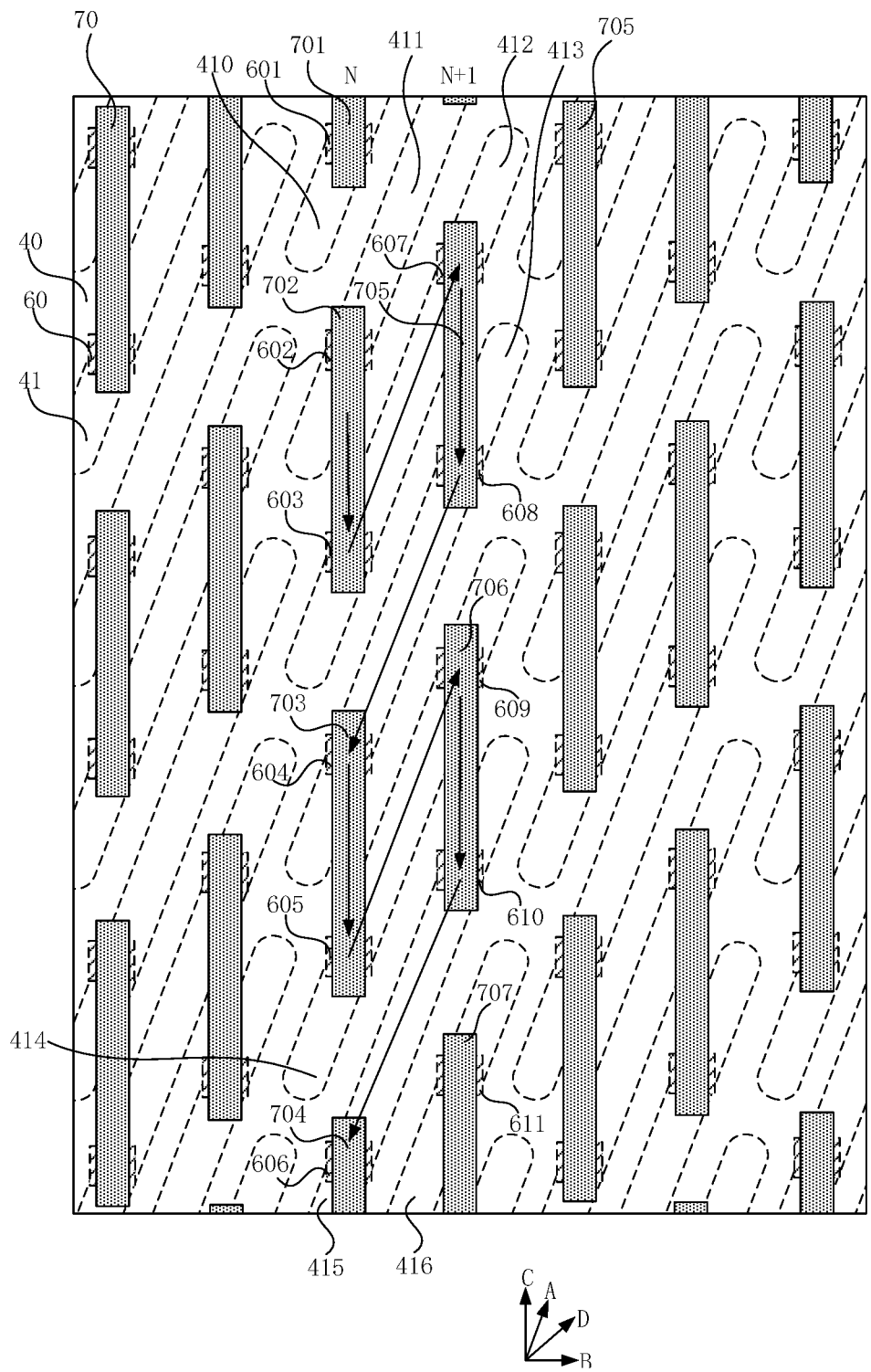
FIG. 3 is a schematic top view of a first embodiment of an exemplary semiconductor structure provided by the embodiments of the present application.

FIG. 3 is a schematic top view of a first embodiment of a semiconductor structure of the present application. Referring to FIG. 3, the semiconductor structure includes a semiconductor substrate 40, a plurality of bit line contact structures 60 and a plurality of wire groups.

The semiconductor substrate 40 may be made of at least one of materials mentioned below: Si, Ge, SiGe, SiC, SiGeC, InAs, GaAs, InP, or other III/V compound semiconductors. The semiconductor substrate 40 may further include a multilayer structure composed of these semiconductors, or may be silicon on insulator (SOI), stacked SOI (SSOI), stacked silicon germanium on insulator (S—SiGeOI), SiGeOI, GeOI, etc. As an example, in the embodiments of the present application, a material of the semiconductor substrate 40 is monocrystalline silicon.

The semiconductor substrate 40 is isolated by a shallow trench isolation structure to form a plurality of separate active regions 41, and the active regions 41 extend along the first direction A. In the embodiments of the present application, the active region 41 extends along the first direction A, and the plurality of active regions 41 are arranged along the first direction A. Since the active regions are covered by a dielectric layer above the active regions and the like, the active regions 41 are drawn with dashed lines in the drawing. In the embodiments of the present application, the first direction A is a direction that forms an acute angle with a horizontal direction.

In some embodiments of the present application, the semiconductor structure further includes an array region (not shown in the drawings). The semiconductor substrate in the array region is also isolated by a shallow trench isolation structure to form a plurality of separate active regions. The length of the active regions located in the test region is greater than the length of the active regions located in the array region. For example, in some embodiments of the present application, the length of the active regions located in the test region is twice the length of the active regions located in the array region.

The plurality of bit line contact structures 60 are arranged on the semiconductor substrate 40. Each bit line contact structure 60 is a conductive structure, and may be formed in the same operation as the bit line contact structure in the array region of the semiconductor structure, so that the bit line contact structure can be used as a test-key for testing a resistance of the bit line contact structure in the array region. The bit line contact structures 60 are covered by a wire, so that the bit line contact structures 60 are drawn with dashed lines in the drawing.

In the first direction A, i.e., in the extending direction of the active regions 41, each active region 41 is electrically connected to two bit line contact structures 60. In the embodiments of the present application, in the first direction A, each active region 41 is electrically connected to two bit line contact structures 60 located above each active region 41.

In the first direction A, a set distance is formed between the two bit line contact structures 60. The set distance can depend on a distance between regions, needing to be connected to bit lines, in the active regions. Those skilled in the art can design the set distance according to an actual need. For example, in some embodiments of the present application, each of two ends of the active region 41 needs to be electrically connected to the bit line contact structure 60, so that the distance between the two bit line contact structures 60 is the distance between the two ends of the active region 41.

A plurality of wire groups are arranged along a second direction B. In the embodiments of the present application, the second direction B is the horizontal direction. The plurality of wire groups are arranged along the horizontal direction. The number of the wire groups can be set according to an actual need. In FIG. 3, only 7 wire groups are schematically shown, which should not be regarded as a limitation to the present application.

Each wire group includes a plurality of wires 70 extending along a third direction C. The plurality of wires 70 are successively arranged along the third direction C. In some embodiments of the present application, an angle between the second direction B and the third direction C is 90 degrees, that is, the two directions are perpendicular to each other. In the embodiments of the present application, the second direction B is the horizontal direction, the third direction C is a vertical direction, and the two directions are perpendicular to each other. In other embodiments of the present application, the angle between the second direction B and the third direction C may also be an acute angle.

In the third direction C, each of the two bit line contact structures 60 for each active region 41 is connected to a respective one of the two bit line contact structures 60 for the active region 41 adjacent to said each active region 41 by a respective one of the wires 70, so that two adjacent wire groups of the wire groups cooperate to form a conductive path during testing. Two wire groups of the wire groups corresponding to the active regions successively arranged along the third direction C are matched with each other to form a conductive path with the bit line contact structures and the active regions during testing. For example, in the embodiments of the present application, the active regions 410, 411, 412, 413, 414, 415, and 416 are successively arranged along the third direction C, and the $N^{th}$ wire group and the $(N+1)^{th}$ wire group corresponding to these active regions, the bit line contact structures and these active regions form a conductive path.

For example, in the embodiments of the present application, the $N^{th}$ wire group includes wires 701, 702, 703 and 704, and the $(N+1)^{th}$ wire group includes wires 705, 706 and 707. Referring to FIG. 3, the wire 701 is electrically connected to two bit line contact structures. In FIG. 3, only one bit line contact structure 601 is shown, and the bit line contact structure 601 is electrically connected to the active region 410. The wire 702 is electrically connected to the two bit line contact structures 602 and 603. The bit line contact structure 602 is electrically connected to the active region 411, and the bit line contact structure 603 is electrically connected to the active region 412. The wire 703 is electrically connected to the two bit line contact structures 604 and 605. The bit line contact structure 604 is electrically connected to the active region 413, and the bit line contact structure 605 is electrically connected to the active region 414. The wire 704 is electrically connected to the two bit line contact structures. In FIG. 3, only one bit line contact structure 606 is shown. The bit line contact structure 606 is electrically connected to the active region 415. The wire 705 is electrically connected to the two bit line contact structures 607 and 608. The bit line contact structure 607 is electrically connected to the active region 412, and the bit line contact structure 608 is electrically connected to the active region 413. The wire 706 is electrically connected to the two bit line contact structures 609 and 610. The bit line contact structure 609 is electrically connected to the active region 414, and the bit line contact structure 610 is electrically connected to the active region 415. The wire 707 is electrically connected to two bit line contact structures. In FIG. 3, only one bit line contact structure 611 is shown. The bit line contact structure 611 is electrically connected to the active region 416.

Figure 4:
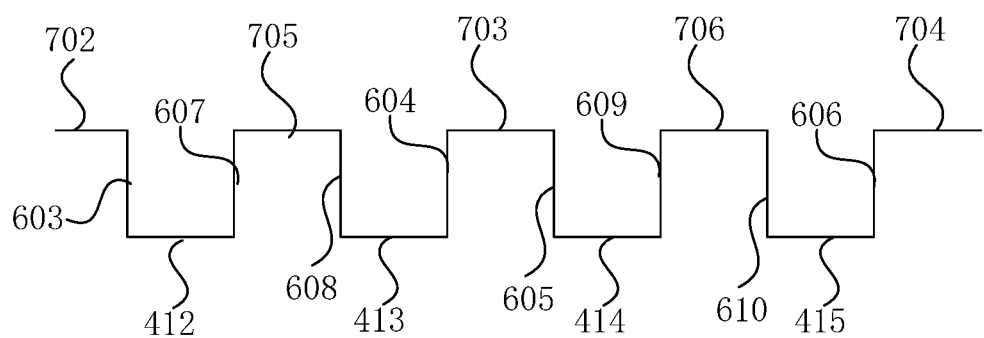
FIG. 4 is a schematic diagram showing a connection relationship of a wire, a bit line contact structure and an active region of the present application.

In the embodiments of the present application, when a voltage is applied to the $N^{th}$ wire group and the $(N+1)^{th}$ wire group, the bit line contact structures and the active regions corresponding to the $N^{th}$ wire group and the $(N+1)^{th}$ wire group form a conductive path. FIG. 4 is a schematic diagram showing a connection relationship of a wire, a bit line contact structure and an active region of the present application. Referring to FIG. 3 and FIG. 4, as shown by the arrows in FIG. 3, when a voltage is applied to the $N^{th}$ wire group and the $(N+1)^{th}$ wire group, the wire 702, the bit line contact structure 603, the active region 412, the bit line contact structure 607, the wire 705, the bit line contact structure 608, the active region 413, the bit line contact structure 604, the wire 703, the bit line contact structure 605, the active region 414, the bit line contact structure 609, the wire 706, the bit line contact structure 610, the active region 415, the bit line contact structure 606, and the wire 704 form a conductive path.

Figure 5:
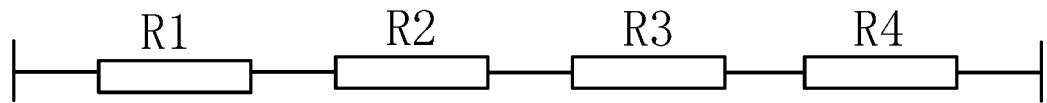
FIG. 5 is an equivalent circuit diagram of a region where an arrow passes through in the semiconductor structure shown in the present application.

FIG. 5 is an equivalent circuit diagram of a region where an arrow passes through in the semiconductor structure of FIG. 3. Referring to FIG. 5, the wire 702 is connected to the wire 705 through the bit line contact structure 603, the active region 412 and the bit line contact structure 607, and a resistor between the wire 702 and the wire 705 is R1. The wire 705 is connected to the wire 703 through the bit line contact structure 608, the active region 413 and the bit line contact structure 604, and a resistor between the wire 705 and the wire 703 is R2. The wire 703 is connected to the wire 706 through the bit line contact structure 605, the active region 414 and the bit line contact structure 609, and a resistor between the wire 703 and the wire 706 is R3. The wire 706 is connected to the wire 704 through the bit line contact structure 610, the active region 415 and the bit line contact structure 606, and a resistor between the wire 706 and the wire 704 is R4. The resistors R1, R2, R3, and R4 are of a series structure.

In order to clearly explain the technical solutions of the present application, this embodiment only illustrates four resistors formed by the wires, the bit line contact structures and the active regions. It can be understood that the wires, the bit line contact structures and the active regions can form a plurality of resistors. These resistors are connected in series to form a conductive path. As more and more resistors are connected in series, the total resistance of the conductive paths will become higher and higher, and the influence of external interference on measurement results will become less and less, which reduces an error of test of the semiconductor structure and improves the accuracy of test of the semiconductor structure.

In some embodiments of the present application, the lengths of the wires 70 are equal. The wires 70 in the same wire group have the same length, or the wires 70 in different wire groups have the same length, so as to minimize the influence of the wires 70 on the resistors. For example, in the embodiments of the present application, the wires 70 in different wire groups have the same length, that is, the lengths of all the wires are equal. In other embodiments of the present application, the lengths of the wires in the same wire group are equal, and the lengths of the wires in different wire groups are not equal.

In some embodiments of the present application, the wires 70 in the same wire group are equally spaced apart from each other, and the spacing between the wires 70 may depend on the distance between adjacent active regions in the extending direction of the wires. For example, in the embodiments of the present application, the spacing between the wires 70 depends on the distance between adjacent active regions in the third direction C. The longer the distance, the larger the spacing between the wires 70, and the shorter the distance, the smaller the spacing between the wires 70. In other embodiments of the present application, the spacing between two of all the wires 70 in the third direction C are equal.

In some embodiments of the present application, the wires in different wire groups are misaligned with each other in a fourth direction. The wires in different wire groups are misaligned with each other in the fourth direction D. For example, in the fourth direction D, the wire 702 in the $N^{th}$ wire group and the wire 705 in the $(N+1)^{th}$ wire group are not on the same standard line, and are misaligned with each other.

In some embodiments of the present application, in the embodiment of the present application, the bit line contact structures 60 form a plurality of bit line contact structure groups arranged along the second direction. For example, referring to FIG. 3, the bit line contact structures 601, 602, 603, 604, 605 and 606 form one bit line contact structure group, and the bit line contact structures 607, 608, 609, 610, 611 form another bit line contact structure group. The two bit line contact structure groups are successively arranged along the second direction B.

In some embodiments of the present application, the bit line contact structures in each bit line contact structure group are arranged along the third direction. For example, in the bit line contact structure group formed by the bit line contact structures 601, 602, 603, 604, 605 and 606, the bit line contact structures 601, 602, 603, 604, 605 and 606 are successively arranged along the third direction C. In the bit line contact structure group formed by the bit line contact structures 607, 608, 609, 610, and 611, the bit line contact structures 607, 608, 609, 610 and 611 are successively arranged along the third direction C. In the embodiments of the present application, the bit line contact structures in the same bit line contact structure group are aligned with each other in the third direction C. In other embodiments of the present application, the bit line contact structures in the same bit line contact structure group may be successively arranged in the third direction C, but are misaligned with each other.

Figure 6:
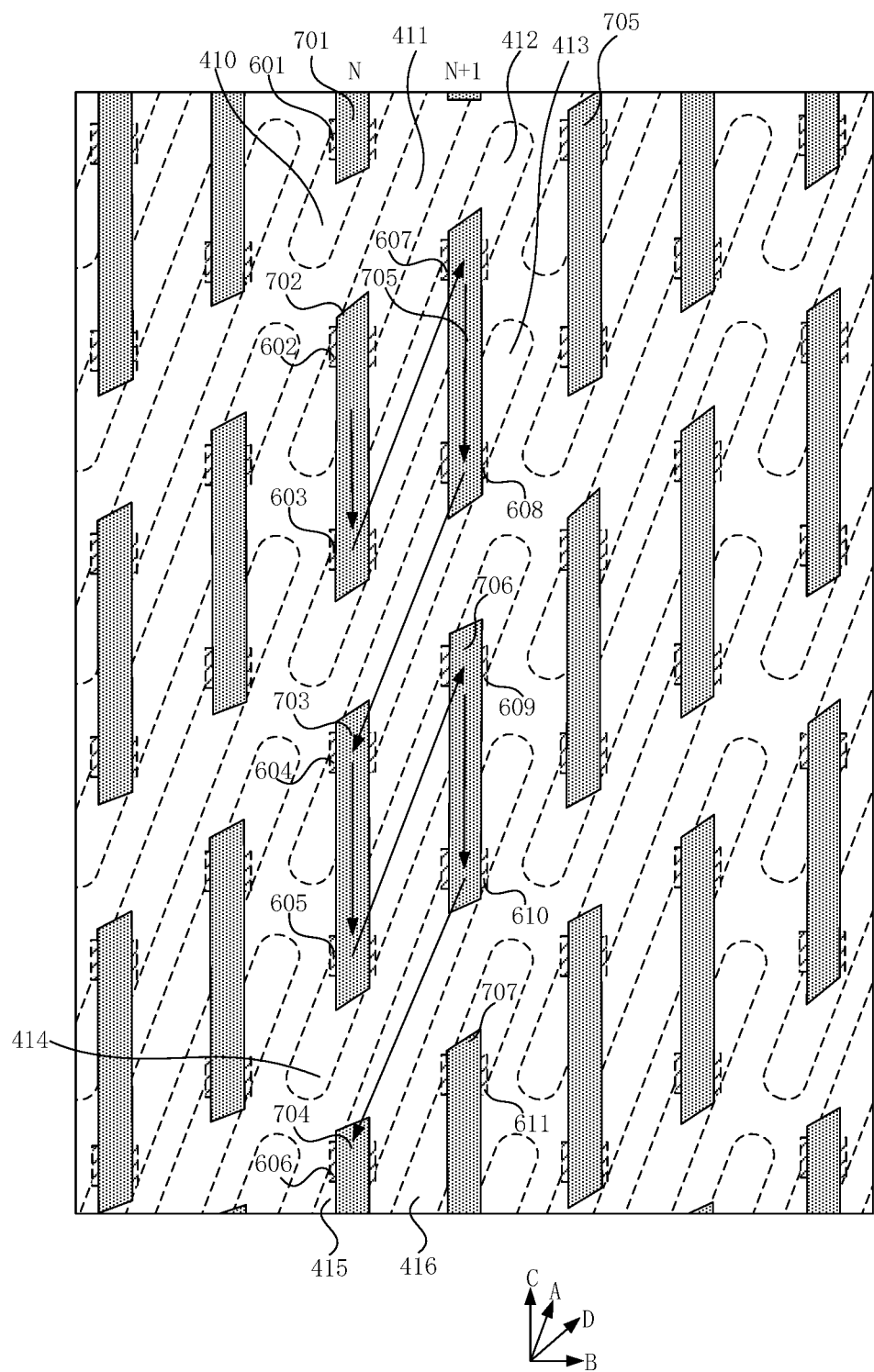
FIG. 6 is a schematic top view of a second embodiment of a semiconductor structure of the present application.

In another embodiment of the present application, an end of each wire is inclined in the fourth direction. Referring to FIG. 6, a schematic top view of a second embodiment of a semiconductor structure of the present application is illustrated. In this embodiment, a plurality of wires in each wire group are formed by cutting an entire wire in a fourth direction according to a set distance. The end of each wire is inclined in the fourth direction. The wires in the $N^{th}$ wire group are formed by cutting an entire wire in the fourth direction according to a set distance. After the cutting, the end of each wire is inclined in the fourth direction. For example, the end (shown by the arrow in the drawing) of the wire 701 is inclined in the fourth direction D. The set distance is set to enable the formed wires to connect the bit line contact structures in two adjacent active regions with each other.

In some embodiments of the present application, in the second embodiment, an angle between the fourth direction D and the second direction B is a preset value, and the preset value is based on a pattern of the bit line contact structures to avoid the bit line contact structures from being destroyed during the cutting. The preset value may range from 30 degrees to 50 degrees. If the preset value is too large or too small, the cutting may pass through the bit line contact structures during cutting, thereby destroying the bit line contact structures. It can be understood that, in order to avoid the bit line contact structures from being destroyed during cutting, the preset value can also be selected according to an actual process.

The above descriptions are only some embodiments of the present application. It should be noted that those of ordinary skill in the art can further make several improvements and retouches without departing from the principles of the present application. These improvements and retouches shall also all fall within the protection scope of the present application.

The invention claimed is:

1. A semiconductor structure, wherein the semiconductor structure is provided with a test region, and in the test region, the semiconductor structure comprises:
a semiconductor substrate provided with a plurality of separate active regions extending along a first direction;
a plurality of bit line contact structures arranged on the semiconductor substrate, wherein in the first direction, each active region is electrically connected to two bit line contact structures; and
a plurality of wire groups arranged along a second direction, wherein each wire group comprises a plurality of wires extending along a third direction, and in the third direction, each of the two bit line contact structures for each active region is connected to a respective one of the two bit line contact structures for the active region adjacent to said each active region by a respective one of the wires, so that two wire groups of the wire groups cooperate with each other to form a conductive path;
wherein the wires in different wire groups re misaligned with each other in a fourth direction;
wherein the plurality of wires in each group are formed by cutting an entire wire in the fourth direction according to a set distance, and an end of each wire is inclined in the fourth direction;
wherein an angle between the fourth direction and the second direction is a preset value, and the preset value is set according to a pattern of the bit line contact structures to avoid the bit line contact structures from being destroyed during the cutting; and
wherein the preset value ranges from 30 degrees to 50 degrees.

2. The semiconductor structure of claim 1, wherein the wires in a same wire group or the wires in different wire groups have a same length.

3. The semiconductor structure of claim 1, wherein the wires in a same wire group are equally spaced apart from each other.

4. The semiconductor structure of claim 1, wherein an angle between the second direction and the third direction is 90 degrees.

5. The semiconductor structure of claim 1, wherein the bit line contact structures form a plurality of bit line contact structure groups arranged along the second direction.

6. The semiconductor structure of claim 5, wherein the bit line contact structures in each bit line contact structure group are arranged along the third direction.

7. The semiconductor structure of claim 1, wherein the semiconductor structure further comprises an array region, and a length of the active regions located in the test region is greater than a length of the active regions located in the array region.

8. The semiconductor structure of claim 7, wherein the length of the active regions located in the test region is twice the length of the active regions located in the array region.

9. The semiconductor structure of claim 1, wherein the first direction is a direction that forms an acute angle with a horizontal direction.

10. The semiconductor structure of claim 1, wherein the second direction is a horizontal direction.

11. The semiconductor structure of claim 1, wherein each bit line contact structure is a conductive structure.

12. The semiconductor structure of claim 1, wherein in the first direction, a set distance is formed between the two bit line contact structures.

13. The semiconductor structure of claim 1, wherein an angle between the second direction and the third direction is an acute angle.

* * * * *